United States Patent [19]

Whitley et al.

[11] Patent Number: 4,513,493

[45] Date of Patent: Apr. 30, 1985

[54] COMPONENT LEAD PROCESSING DEVICE

[75] Inventors: George J. Whitley, Philadelphia, Pa.; Martin Rayl, Lawrenceville, N.J.

[73] Assignee: RCA Corporation, Princeton, N.J.

[21] Appl. No.: 302,294

[22] Filed: Sep. 14, 1981

[51] Int. Cl.³ .................. B23P 19/00; H05K 3/30
[52] U.S. Cl. .................. 29/566.3; 29/739; 29/838; 83/200; 140/105
[58] Field of Search .......... 29/33 M, 564.1, 566.3, 29/566.4, 739, 741, 759, 760, 831, 832, 835, 837, 838; 83/199, 200, 580; 140/1, 105, 93 D; 74/105, 107, 109, 471 R, 665 F

[56] References Cited

U.S. PATENT DOCUMENTS

| 2,827,634 | 3/1958 | Kwasniewski | 1/102 |
| 3,167,779 | 2/1965 | Ahearn | 1/210 |
| 3,414,024 | 12/1968 | Anderson et al. | 140/1 |
| 3,574,934 | 4/1971 | DeRose | 29/626 |
| 3,732,898 | 5/1973 | Boyer | 140/105 |
| 4,051,593 | 10/1977 | Mori et al. | 29/564.6 |
| 4,054,988 | 10/1977 | Masuzima et al. | 29/564.6 |
| 4,153,082 | 5/1979 | Foley | 140/105 |
| 4,165,557 | 8/1979 | Taguchi et al. | 29/566.3 |
| 4,377,026 | 3/1983 | Whitley | 29/564.1 |

FOREIGN PATENT DOCUMENTS

| 35214 | 12/1953 | Poland | 74/105 |
| 1350924 | 4/1974 | United Kingdom | 29/741 |
| 706947 | 12/1979 | U.S.S.R. | |

Primary Examiner—Z. R. Bilinsky
Attorney, Agent, or Firm—Joseph S. Tripoli; George E. Haas; William Squire

[57] ABSTRACT

A lead cutting and clinching device includes a housing to which an air cylinder and a cylindrical anvil are secured. A lead cutting and clinching element driven by the air cylinder is rotatably mounted to the anvil and has a cylindrical outer peripheral edge coextensive with the anvil outer surface. A portion of the outer peripheral surface of the lead cutting and clinching element, outer surface of the anvil, and the outer peripheral surface of the housing, in the same angular radial segment having its origin at the axis of rotation of the clinching element are substantially coextensive in a direction parallel to the axis of rotation of the clinching element. An array of these component lead processing devices may be formed with the circular surfaces in the radial segments contiguous with each other to closely space the lead cutting and clinching elements of the array.

15 Claims, 8 Drawing Figures

COMPONENT LEAD PROCESSING DEVICE

The present invention relates to component lead processing devices, and more particularly, to devices which cut and clinch component leads to printed circuit boards.

As known, printed circuit boards include numerous closely-spaced lead receiving apertures. Components may be automatically or manually assembled to the circuit board, which may be on a conveyor, by inserting component leads through the corresponding circuit board apertures. Later in the process it is required that the undersurface of the board pass over a wave soldering machine or the like which solders the protruding component leads to printed circuit board conductors. However, there is a time interval between the time the component leads are inserted into the circuit board apertures and the time the circuit board passes through the soldering apparatus. During this time interval it is possible for the components to disengage from the circuit board.

Another problem is that components of different types, for example, transistors, capacitors, resistors, and even some of the same type, may have leads of different lengths.

It is required that the leads be trimmed to a reasonable length where they protrude from the printed circuit board undersurface to facilitate soldering the leads to the circuit board. Further, to prevent the components from becoming disengaged from the circuit board, it is desired that the protruding leads, after trimming, be crimped or bent over against the circuit board undersurface to preclude the leads from falling out of their corresponding apertures.

Various devices have been employed to perform the lead processing steps such as trimming, bending, and clinching. However, printed circuit boards tend to become relatively crowded with components which are closely spaced on the board. It is therefore desirable to cut and clinch the protruding leads in as compact a process as possible. Due to the relative bulk of the component lead trimming and clinching devices, many such devices are required in the assembly line to process closely-spaced adjacent component leads. An example of one such component lead trimming and clinching apparatus is disclosed and described in copending application entitled "Apparatus for Deforming Leads on Conveyorized Printed Circuit Boards," Ser. No. 075,585, filed Sept. 14, 1979, by George John Whitley and assigned to the same assignee as the present invention, now U.S. Pat. No. 4,377,026. As described therein, component lead trimming and clinching devices may be rotatably actuated by solenoid devices. However, such solenoid devices tend to be relatively bulky, limiting the spacing of adjacent component lead processing devices. Other component lead processing mechanisms are known but they all have a common disadvantage of relative bulkiness, limiting their deployment in closely-spaced environments. For example, such mechanisms are disclosed in U.S. Pat. Nos. 2,827,634; 3,574,934; 3,732,898; 4,153,082; 4,054,988; 3,414,024; 4,051,593; 4,165,557; and 3,167,779 among others. To employ the above-disclosed or other similar devices for processing leads of closely-spaced components requires that the processing devices be duplicated downstream in an assembly line. One set of component lead processing devices operate on widely spaced component leads and a second set of further downstream component lead processing devices process the leads of components adjacent to the previously processed leads.

In U.S. Pat. No. 3,574,934, component leads are trimmed by a saw 28 in FIG. 6. The component leads also are bent by a roller 31 as shown in FIGS. 10 and 11. However, that apparatus bends all of the component leads in the crimping operation in the same direction which may not always be desirable.

A component lead processing device in accordance with the present invention includes a support body, a rotatable lead processing head secured to the body for processing the component leads when the head is rotated about a given axis, and actuating means secured to the body for operating the processing head to cause the head to rotate and process the leads. The head has an outer surface extending in a given radial direction with respect to the axis a first distance. The body extends in the same radial direction as the given radial direction a second distance substantially no greater than the first distance. The actuating means extends in the same radial direction as the given radial direction a third distance substantially no greater than the first distance. As a result, an array of component lead processing devices may be secured with the heads contiguous at the outer surface in the given radial direction to form a compact array for processing the leads of closely-spaced components on a printed circuit board.

Figure 1:
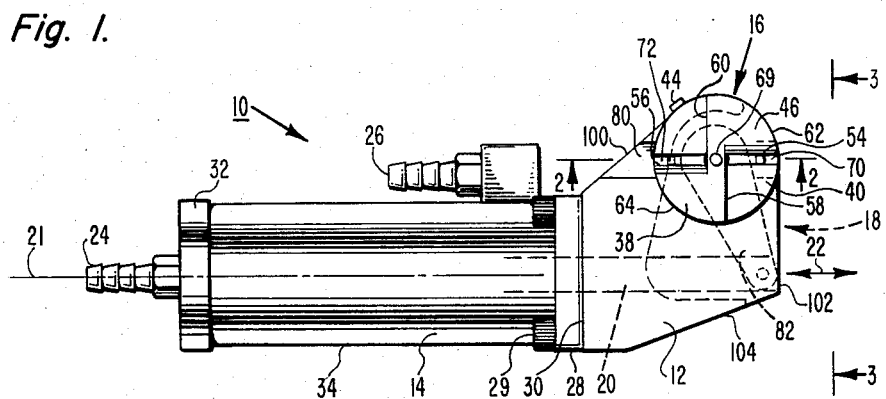
FIG. 1 is a plan view of a component lead processing device embodying the present invention.

Component lead processing device 10, FIG. 1, includes a housing 12, an air cylinder 14, a lead processing head 16 and actuating connecting means 18 for causing the operating shaft 20 of the cylinder 14 to rotate and operate the lead processing head 16 as will be described. In the following description of the device 10, FIGS. 1-4 will be referred to.

The air cylinder 14 includes an actuating shaft 20 which moves in either one of directions 22 in response to application of gas, usually air, under pressure applied to a corresponding one of nozzles 24 and 26. The air cylinder 14 has a flange 28 which is screwed by screws 29 to a face 30 of the housing 12. Nozzle 24 protrudes beyond the end flange 32 and the nozzle 26 is attached to the peripheral surface 34 of the cylinder 14. The nozzle 26 may be oriented in any one of four different orientations with respect to the housing 12. Shaft 20 is in the center of the square flange 28. The flange 28 can be attached to the housing 12 in any one of four different orientations about an axis 21 through the shaft 20. The various orientations of the nozzle 26 are advantageous for providing enhanced flexibility in positioning the device 10 when deployed in an array. Air cylinders with other different nozzle orientations may be employed in the alternative.

The lead processing head 16 comprises an anvil 36 and a cut-and-clinch member 38. The anvil 36 includes a right circular cylindrical anvil member 40 and a hollow shaft 42. Shaft 42 depends from member 40, FIG. 2. The hollow shaft 42 is secured to the housing 12 by a set screw 44, FIGS. 1 and 4. The cut-and-clinch member 38 has a cutting head 46 and a shaft portion 48 for driving head 46, FIG. 2. The shaft portion 48 comprises a circular cylindrical segment 50 and a square segment 52. The circular cylindrical segment 50 is rotatably mounted within the hollow of shaft 42, FIG. 2, for rotation about axis 58. Cut-and-clinch head 46 includes two parallel straight cutting edges 54 and 56, FIG. 1. Each of the cutting edges 54 and 56 is beveled. Two parallel head 46 edges 58 and 60 meet with the respective edges 54 and 56 at respective right angles to form open areas in the head 46, as shown, dividing head 46 into two opposite cut-and-clinch segments. The outer peripheral edges 62 and 64 of the two segments of the head 46 lie in the same circle. The cutting edges 54 and 56 are each parallel to a diameter of this circle. The cutting edges 54 and 56 are spaced a small distance from that diameter. A small boss 69 projects from the upper surface 66 of the head 46, FIGS. 2 and 3. The boss 69 serves to space the head 46, surface 66, FIG. 3, from a printed circuit board 71 (dashed lines) under surface 73 to permit the portion of the leads bent by the head 46 to be positioned between the surface 66 and the undersurface 73.

Figure 2:
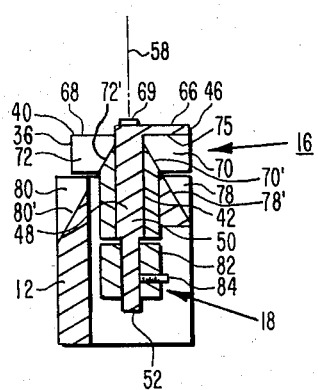
FIG. 2 is a sectional elevation view taken through lines 2—2 of the device of FIG. 1.

The plane undersurface 75 of the head 46 is in sliding engagement with the upper surface 68, FIG. 2, of the anvil member 40. Anvil member 40 has a circular outer peripheral surface coextensive with the circular peripheral edges 62 and 64 of head 46. In other words, the radius of the outer cylindrical surface of the anvil member 40 from axis 58 has substantially the same length as the radius of the head 46, FIG. 3. The anvil 36 may be made of hardened tool steel. Formed in the anvil member 40 are two slots 70, 72 on opposite sides of the center of the circle. The slots 70 and 72 serve to receive the extended leads (not shown) of a component being trimmed secured to printed circuit board 71. The component leads are inserted in respective slots 70, 72. The cut-and-clinch head 46 is then rotated clockwise, FIG. 1. This causes the cutting edges 54 and 56 to slide over the surface 68 of the anvil, trimming the component leads, severing them substantially coplanar with surface 68. The cut-and-clinch head 46 continues to rotate so that the beveled portions of the cutting edges 54 and 56 wipe against the remaining portions of the leads projecting from surface 73 bending the projecting portions of the leads (not shown) into the space between the printed circuit board surface 73 and the upper surface 66 of the head 46, clinching them to the printed circuit board.

Figure 4:
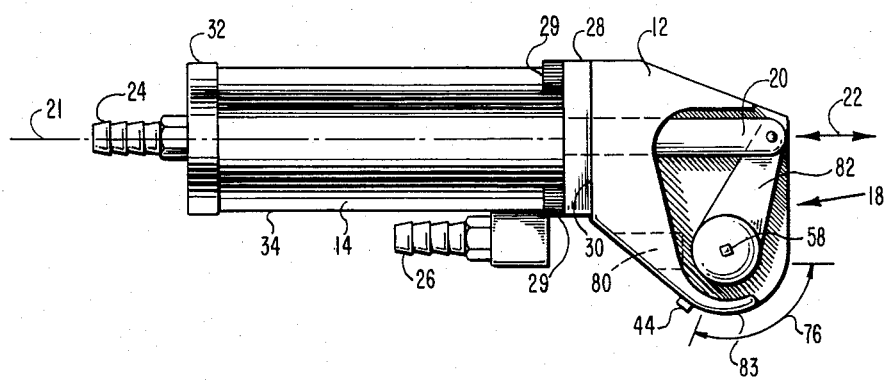
FIG. 4 is a bottom view of the device of FIG. 3 taken along lines 4—4.

In FIG. 4, the housing 12 has, in one embodiment a circular outer surface 83 in angular segment 76. Surface 83 has a radius which is substantially the same as and substantially no greater than that of the outer peripheral surfaces of the cut-and-clinch head 46 and anvil member 40, which surfaces may also be circular. That is, the anvil member 40 and the housing surface 83 in the angular segment 76, FIG. 4, extend radially from the axis 58 a distance which is shown substantially the same as the radial distance from axis 58 to the edges 62 and 64 of head 46, may be less than but may be substantially no greater than the radial distance from axis 58 to the outer edges of the head 46. The reason for these radial relationships will be explained later.

Housing 12 has a pair of slots 78 and 80, FIG. 2, coextensive with and slightly larger than and beneath respective slots 70 and 72 in the anvil member 40. Slots 70, 72 in member 40 and slots 78, 80 in the housing have respective 70', 72', 78', and 80' sloping walls as shown in FIG. 2. The sloping walls of slots 72, 70 are coextensive with the respective sloping walls of slots 80, 78. The sloping walls of the adjacent slot pairs 70, 78 and 72, 80 are continuous. Slots 70, 72, 78 and 80 receive the trimmed lead cut ends causing the ends to fall around device 10 and to an area below device 10. While two cutting edges are shown in the cut-and-clinch member 38, it will be appreciated that more or fewer cutting edges may be provided in accordance with a given implementation.

Figure 3:
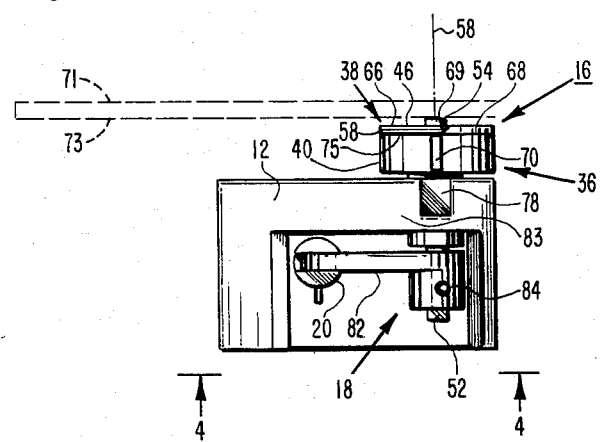
FIG. 3 is an end view of the device of FIG. 1 taken along lines 3—3.

Air cylinder 14 actuating shaft 2 is pinned to a bell crank 82, FIGS. 3 and 4, which has a mating square aperture for receiving the square segment 52 of the cut-and-clinch member 38. Bell crank 82 is secured to the square segment 52 by a set screw 84, FIG. 2. In the alternative, the bell crank can be pinned to segment 52.

In operation, when the air cylinder is operated by air pressure received through one of the nozzles 24, 26, the shaft 20 is retracted into the cylinder in one of the directions 22. This rotates the bell crank 82, FIG. 4, counterclockwise about axis 58. This action rotates the cut-and-clinch member 38 about axis 58, sliding the cutting edges 54 and 56 over the anvil surface 68, cutting the leads inserted in the anvil slots 70 and 72. The beveled edges of the cutting edges 54 and 56 then bend the leads and clinch them against the printed circuit board surface 73, as described above.

As can be seen, the outer peripheral edges 62 and 64 of the cut-and-clinch member 38, outer surface of anvil member 40 and the outer surface of housing 12 in the angular segment 76, FIG. 4, are all coextensive in the vertical direction (top to bottom of drawing, FIG. 3) so that the cutting edges of the cut-and-clinch member 38 extend to and terminate at these peripheral outer surfaces of the housing 12 and anvil 36. This is important as a number of identical devices or similar devices 10 may be assembled in an array with the housings touching or closely spaced to each other within the area of angular segment 76. This array enables the axis of rotation 58 of adjacent ones of the devices 10 to be extremely close. The cut-and-clinch heads 46 of a number of different devices 10 may be spaced very closely to process closely spaced components on a printed circuit board. While the surfaces of head 46, anvil member 40 and housing 12 are shown coextensive in angular segment 76, they may differ from that coextensive relationship somewhat in keeping with the purpose of their relationship as described below.

Figure 5:
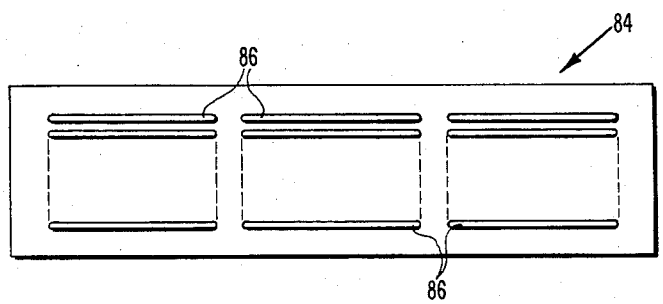
FIG. 5 is a plan view of a universal plate for receiving devices shown in FIG. 1.
Figure 6:
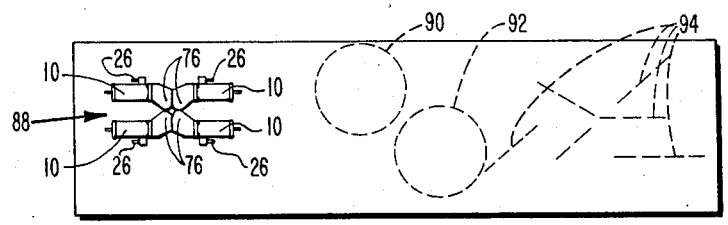
FIG. 6 is a plan view of the plate of FIG. 5 with exemplary arrays of the devices of FIG. 1 attached thereto.

In FIG. 5, a universal plate 84 has a plurality of parallel elongated slots 86. The plate is secured adjacent a printed circuit board conveyor (not shown). In FIG. 6 a plurality of the devices 10 are assembled to slots 86 in different arrays. Array 88 employs four devices 10 which are contiguous in the angular segments 76, closely spacing four cut-and-clinch members 38 to each other. Because the cutting edges of the cut-and-clinch members 38 extend to and terminate at the contiguous outer surfaces of each of the devices 10 in segments 76, very closely-spaced leads may be processed by such an array. Because the cutting edges extend over a relatively large distance compared to a component lead diameter, components of varying lead spacing may be processed by one or more of the devices 10. In FIG. 6, the nozzles 26 of the various devices 10 have different orientations. Dashed circles 90 and 92 show different positions on the plate 84 of different device 10 arrays such as array 88. The straight dashed lines 94 each illustrate a separate different device 10 orientation in which directions 22 is parallel to a dashed line. These are only a few of a large number of different orientations and configurations of the device 10.

Figure 7:
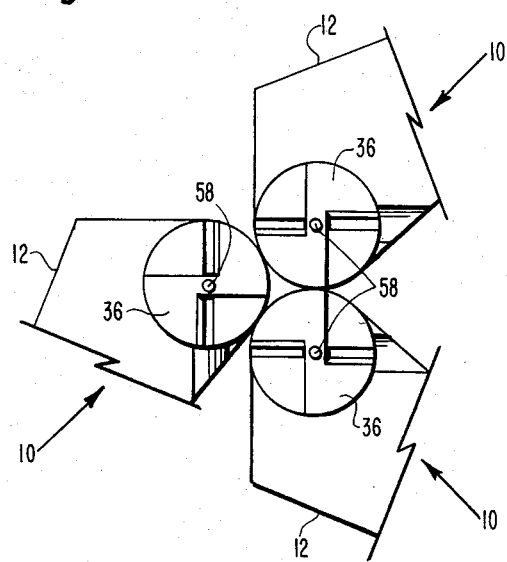
FIG. 7 is a plan view of one array of devices of FIG. 1 which may be attached to the plate of FIG. 5.

In FIG. 7, an array of three devices is shown with the cut-and-clinch heads contiguous with each other in angular segments 76. It is possible to place the devices 10 in closely-spaced arrays in many different locations on a conveyor as determined by the slots 86 of plate 84, FIG. 5, for processing numerous component leads regardless their compact arrangement. Importantly, very small spacing of component leads on adjacent small components may be processed simultaneously.

While the angular segment 76 of FIG. 4 is shown approximately 135°, its angular extent may vary in accordance with a given implementation.

The housing 12, FIG. 1, has outer surfaces 100, 102, and 104 formed in different angular relationships. Surface 100 is about 45° to axis 21, surface 102 is normal to axis 21, and surface 104 is about 30° to axis 21. These angular relationships permit an optimum number of devices 10 to be placed in a given array. The actuating mechanism comprising the shaft 20 and bell crank 82 are all located within the outer peripheral surfaces 100, 102, and 104 of the housing 12. In one example, the elements comprising housing 12 and bell crank 82 extend a distance in a radial direction from axis 58 less than that of the anvil 36 and the cut-and-clinch member 38.

Figure 8:
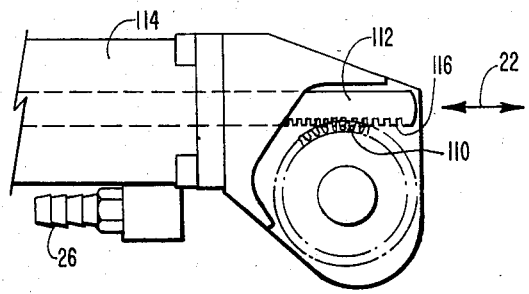
FIG. 8 is a schematic view of a second embodiment of the device of the present invention.

FIG. 8, shows an alternative embodiment of the actuating mechanism for operating the cut-and-clinch head 38. A pinion 110 is connected to square segment 52 of cut-and-clinch member 38, FIG. 2, and a shaft 112 of the cylinder 114 is formed with rack teeth 116 which mate with the teeth of pinion 110. Operation of the shaft 112 in directions 22 rotates the pinion 110, rotating the cut-and-clinch member 38. The bell crank and rack and pinion mechanisms are exemplary as other mechanisms may be employed instead. The different arrays of cut-and-clinch devices 10 provided herein, greatly enhances the possible spacing of the cut-and-clinch devices. The compact array arrangement described herein greatly reduces the size of a cut-and-clinch apparatus for processing leads inserted in a printed circuit board. This substantially reduces the cost of such a mechanism by reducing the number and spacing of the devices, simplifying the lead processing portion of the printed circuit board manufacturing process.

What is claimed is:

1. A component lead processing apparatus comprising:
    a plurality of lead processing devices, each device comprising:
        a support body;
        a lead processing head rotatably mounted in said body for processing said component leads when the head is rotated about a given axis; and
        actuating means secured to said body for operating said processing head to cause said head to rotate and process said leads, said head having an outer surface extending in a given radial direction with respect to said axis a first distance, said body extending in the same radial direction as said given radial direction from said axis a second distance substantially no greater than said first distance in a given angular segment about said axis, said actuating means extending in the same radial direction as said given radial direction a third distance substantially no greater than said first distance in said angular segment; and
    means for locating said plurality of devices with at least a pair of said heads contiguous at said outer surface within said angular segment.

2. The device of claim 1 wherein said radial direction is normal to said axis.

3. The device of claim 1 wherein said radial direction includes a plurality of radial directions lying in a range of at least 90°.

4. The device of claim 1 wherein said head includes a circular cylinder, said outer surface comprising the surface of said cylinder.

5. The device of claim 1 wherein said body and said head are each a segment of a circular cylinder, said segments lying in about the same angular segment and concentric with respect to said axis.

6. The device of claim 1 wherein said actuating means includes piston means, and a bell crank connected to said piston means and said head for rotating said head about said axis in response to the operation of said piston means.

7. The device of claim 1 wherein said actuating means comprises piston means and rack and pinion means connected to said piston means and said head for operating said head in response to the operation of said piston means.

8. The device of claim 1 further including an array of said devices each contiguous to each other at said head outer surface.

9. The device of claim 8 wherein said devices each having identical constructions, each head outer surface comprising a circular cylindrical surface concentric with its corresponding axis.

10. A component lead processing tool comprising:
    a plurality of lead processing devices, each device comprising:
        a support housing;
        a component lead processing head rotatably secured to said housing for rotation about a first axis; and
        actuating means secured to said housing for rotating said head about said first axis;
        said head having its outer edge spaced in a radial direction from said axis a first distance, said actuating means and said housing having an outer edge with respect to said axis extending in said radial direction respective second and third distances, at most substantially no greater than said first distance; and
    means for locating said plurality of devices with at least a pair of said heads contiguous at said outer surface within said angular segment.

11. The tool of claim 10 wherein said head includes an anvil and lead cutting and crimping means rotatably secured with respect to said anvil, said anvil being secured to said housing, said cutting and crimping means being coupled to said actuating means.

12. The tool of claim 11 wherein said anvil and crimping means each have an outer circular surface approximately coextensive with the outer surface of said housing in said radial direction.

13. The tool of claim 11 wherein said radial direction is in a range of at least about 135° with respect to radial lines having their origin at said axis.

14. In a component lead processing apparatus the combination comprising:

an array of lead processing tools, each having a body and a generally circular rotatable lead cutting head a fraction of the size of the body, a generally circular anvil with a radius of curvature about the same length of that of the cutting head on which the head rotates and a housing including a circular portion with a radius of curvature not greater than that of the head, the outer surface of the heads of the tools in the array lying in at least one substantially common plane and being contiguous at the circular portions thereof, whereby the cutting heads of the tools can be closely spaced in a small area.

15. The array of tools of claim 14 wherein each tool includes head driving means comprising an air cylinder having a shaft which moves in a direction normal to the axis of rotation of the head and means operating said head in response to the movement of said shaft.

* * * * *